(12) United States Patent  (10) Patent No.: US 7,759,955 B2
Reinwald et al. (45) Date of Patent: Jul. 20, 2010

(54) METHOD AND DEVICE FOR POSITION DETECTION USING CONNECTION PADS

(75) Inventors: Franz Reinwald, Wernberg (AT); Gerhard Zojer, Schiefling am See (AT)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 11/963,073

(22) Filed: Dec. 21, 2007

(65) Prior Publication Data

US 2009/0160470 A1 Jun. 25, 2009

(51) Int. Cl.
*G01R 31/02* (2006.01)
*G01R 31/26* (2006.01)

(52) U.S. Cl. ............ 324/758; 324/754; 324/765; 324/158.1; 438/17

(58) Field of Classification Search ......... 324/754–765, 324/158.1; 438/14–18
See application file for complete search history.

(56) References Cited

U.S. PATENT DOCUMENTS

| 4,703,252 | A | | 10/1987 | Perloff et al. |
| 4,755,746 | A | | 7/1988 | Mallory et al. |
| 5,506,510 | A | * | 4/1996 | Blumenau ............... 324/754 |
| 6,791,349 | B2 | * | 9/2004 | Nagel et al. ............ 324/763 |
| 7,573,278 | B2 | * | 8/2009 | Takasu ................... 324/754 |
| 2007/0090851 | A1 | * | 4/2007 | Kim et al. ............... 324/763 |
| 2008/0218189 | A1 | * | 9/2008 | Lin et al. ................ 324/758 |

FOREIGN PATENT DOCUMENTS

WO 9208144 5/1992

* cited by examiner

*Primary Examiner*—Ha Tran T Nguyen
*Assistant Examiner*—Emily Y Chan
(74) *Attorney, Agent, or Firm*—Dicke, Billig & Czaja, PLLC

(57) ABSTRACT

A semiconductor and method is disclosed. One embodiment includes a detector arrangement to detect the position of a connection element. A probe tip, the detector arrangement including first connection pads are arranged on a substrate surface. A first circuit is connected to the first connection pads.

12 Claims, 3 Drawing Sheets

METHOD AND DEVICE FOR POSITION DETECTION USING CONNECTION PADS

BACKGROUND

The present invention relates to a semiconductor substrate, a method of determining the position of a connection element, and a method of connecting a connection element with a semiconductor substrate.

Semiconductor chips include contact pads on one or more of their surfaces. Integrated circuit manufacturing techniques incorporate a plurality of identical chips on a large semiconductor wafer. These chips are tested at the wafer or individual chip level to determine which ones may be utilized in subsequent manufacturing steps.

The equipment for performing these tests includes a connection element, and a probe tip, for making contact with the contact pads on the individual semiconductor chips. Because of the small size of the chips, the number of contact pads on an individual chip, and the small size of the contact pads, it is necessary to precisely align the probe tips with the contact pads on the chip. For this purpose it will be necessary to move a probe tip to a desired position where it is intended to make contact with a contact pad on the chip, to determine the position of the probe tip and to correct the position of the probe tip when it turns out that the actual position does not correspond with the desired position.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The embodiments of a semiconductor substrate, a method of determining the position of a connection element, and a method of connecting a connection element with a semiconductor substrate, may use various types of semiconductor chips or semiconductor substrates, among them logic integrated circuits, analogue integrated circuits, mixed signal integrated circuits, sensor circuits, MEMS (Micro-Electro-Mechanical Systems), power integrated circuits, chips with integrated passives etc. The semiconductor substrate can also be a semiconductor wafer including a plurality of fabricated semiconductor chips.

The semiconductor chips include contact elements or contact pads on one or more of their outer surfaces wherein the contact elements serve for electrically contacting the semiconductor chips. The contact elements or contact pads may be made from any electrically conducting material, e.g., from a metal as aluminum, gold, or copper, for example, or a metal alloy, or an electrically conducting organic material, or an electrically conducting semiconductor material.

The semiconductor substrate may include a detector arrangement to detect the position of a connection element. The connection element can be any connection element which can be placed onto a contact pad or contact element of the semiconductor chip wherein the contact area between the connection element and the contact pad includes or contains a surface area of the contact pad. The connection element can, for example, be a probe tip as is known from conventional semiconductor wafer probing equipment.

Figure 1:
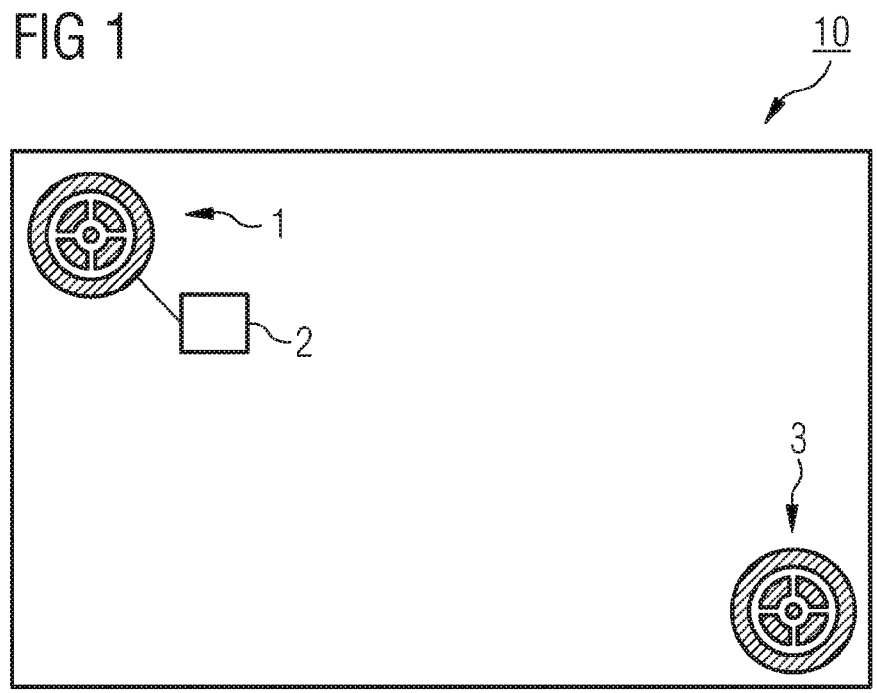
FIG. 1 illustrates a schematic top view representation of one embodiment of a semiconductor substrate.

FIG. 1 illustrates a schematic representation of an embodiment of a semiconductor substrate in a top view. The semiconductor substrate 10 can be any kind of semiconductor chip. The semiconductor substrate 10 may include any kind of circuitry not illustrated in the figure. Moreover the semiconductor substrate 10 includes first connection pads 1 which are arranged on the upper surface of the semiconductor substrate 10. The semiconductor substrate 10 further includes a first circuit 2 connected to the first connection pads 1.

The first connection pads 1 can be arranged in the vicinity of one of the corners of the semiconductor substrate 10. In the embodiment as illustrated in FIG. 1 the first connection pads 1 are arranged in the vicinity of the left upper corner of the semiconductor substrate 10. For example, the distance between a center of the first connection pads 1 and the corner can be less than 5 mm.

The first connection pads 1 and the first circuit 2 can be part of a detector arrangement to detect the position of a connection element. The connection element can, for example, be a probe tip. The connection element can, for example, be mounted at or on a positioning apparatus which is able to move the connection element to a desired position of the surface of the semiconductor substrate 10. The desired position can be indicated by a control signal. By influence of mechanical drift, however, the position of the connection element might deviate from the desired position. Therefore, the first connection pads 1 are arranged to detect the deviation of the connection element. The detected deviation will then be used to re-align the position apparatus and/or the connection element. The semiconductor chip 10 may in addition include second connection pads 3 which are arranged in the vicinity of a corner of the semiconductor chip 10 which lies opposite to the corner in the vicinity of which the first connection pads 1 are arranged. The second connection pads 3 may serve the same function as the first connection pads 1, namely to detect the position of a connection element like a probe tip and, in one embodiment, to detect a deviation of the actual position of the probe tip from a desired position. The second connection pads 3 may for this purpose be connected to a second circuit (not illustrated) in the same way as was described with respect to first connection pads 1 and as will be described further below.

According to one embodiment, at least two of the first connection pads are separated from each other by a distance smaller than a contact area of the connection element. Such an arrangement allows that the connection element may short-circuit the two connection pads. This will be explained further below. For example, each neighboring connection pads can be separated from each other by a distance smaller than a contact area of the connection element. The distance can, for example, be smaller than 1 mm, in one embodiment smaller than 0.5 mm, in one embodiment smaller than 0.4, 0.3, 0.2 or 0.1 mm.

Figure 2:
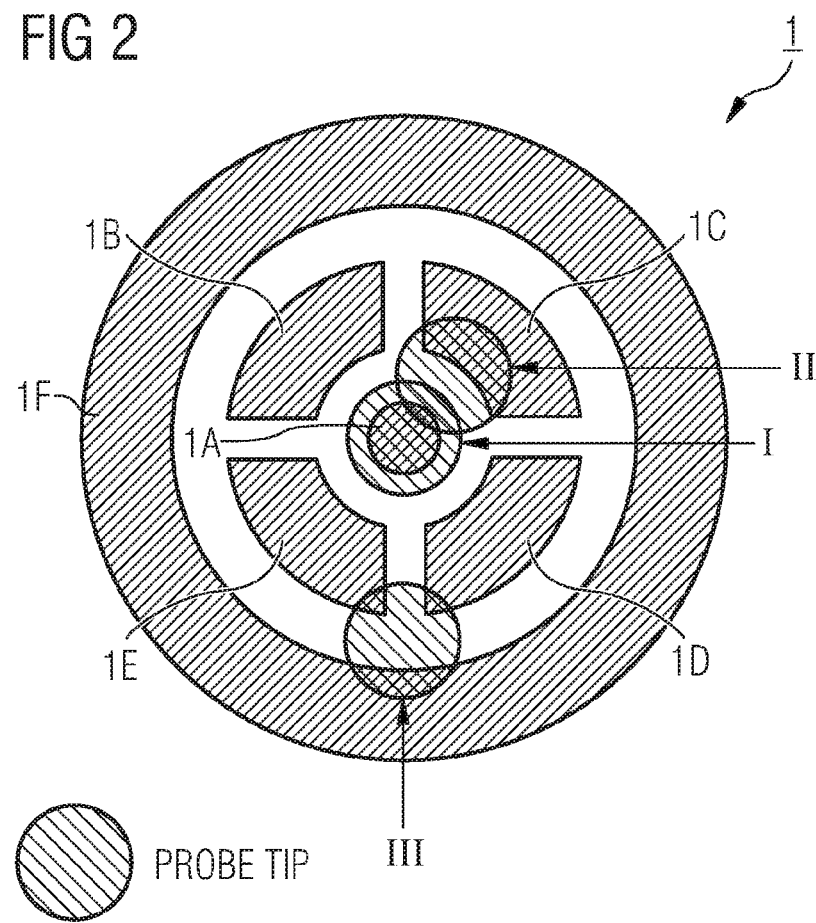
FIG. 2 illustrates a schematic top view of first connection pads for illustrating a further embodiment of a semiconductor substrate.

Referring to FIG. 2, there is illustrated a representation of the first connection pads in a more enlarged top view to illustrate their arrangement with respect to each other and their function in detecting the position of a probe tip.

The first connection pads 1 include a center pad 1A and four quarter pads 1B, 1C, 1D, and 1E which surround the center pad 1A in a way that each one of the quarter pads 1B, 1C, 1D, and 1C cover one forth of a perimeter around the center pad 1A. The first connection pads 1 further include a perimeter pad 1F which surrounds the arrangement of the center pad 1A and the quarter pads 1B, 1C, 1D, and 1E in a contiguous manner.

There are also illustrated arrows I, II and III for illustrating three different situations which may occur when the position of a probe tip is to be determined. It may be assumed that the center pad 1A marks a reference position and the positioning apparatus, which holds the probe tip, receives a control signal indicating that the probe tip is to brought into contact with the center pad 1A. The arrow I illustrates a situation in which the probe tip is positioned exactly onto the center pad 1A so that there is no deviation between the desired position of the probe tip and the position which is actually occupied by the probe tip. However, the arrow II illustrates a situation in which the position occupied by the probe tip deviates from the center position in that the contact area of the probe tip now covers part of the center pad 1A and part of the quarter pad 1C. The arrow III illustrates a situation in which the position occupied by the probe tip deviates from the center position in a way that the contact area of the probe tip with the semiconductor surface covers part of the perimeter pad 1F and part of the quarter pad 1E and the quarter pad 1D. The whole detector arrangement should be able to indicate in which way the actual occupied position of the probe tip deviates from the center position so that adequate re-alignment procedures can be taken.

Figure 3:
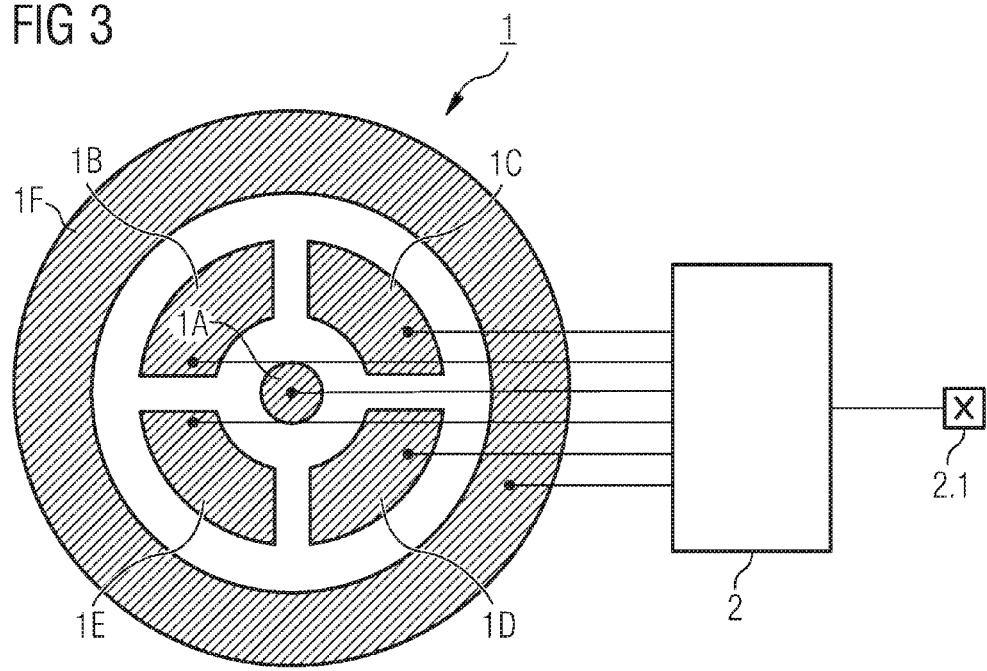
FIG. 3 illustrates a schematic top view of first connection pads and a first circuit for illustrating a further embodiment of a semiconductor substrate.

Referring to FIG. 3, there is illustrated a schematic representation of first connection pads and a first circuit in a schematic top view for illustrating a further embodiment of a semiconductor substrate. The representation of FIG. 3 again illustrates first connection pads 1 being arranged in a form which is identical with the arrangement as illustrated in FIG. 2. FIG. 3 also illustrates a first circuit 2 connected with the first connection pads 1. The first connection pads 1 are connected with the first circuit 2 in a way that each one of the first connection pads 1A-F is connected with the first circuit 2 by using an individual electrical signal line. The first circuit 2 is arranged in a way so that it outputs a particular current or voltage value which indicates the way of deviation of the probe tip as was illustrated in FIG. 2. The first circuit 2 includes or is connected with a common node or common pad 2.1 to which the current value or the voltage value is provided. The common node 2.1 may deliver the current value or the voltage value to an external evaluation circuit in order to arrange for an adequate re-alignment of the positioning apparatus and/or the probe tip. The first circuit 2 may also be arranged on the semiconductor substrate. It may, for example, be arranged in a metallization plane below the surface metallization plane in which the first connection pads 1 are arranged.

Figure 4:
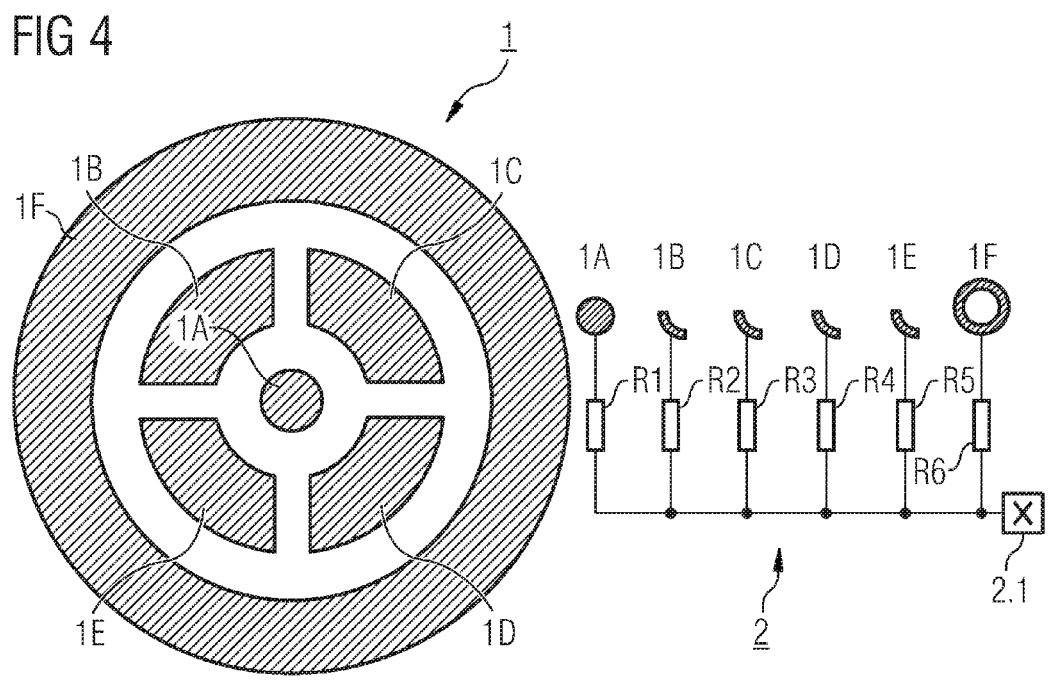
FIG. 4 illustrates a schematic top view of first connection pads and a first circuit for illustrating a further embodiment of a semiconductor substrate.

Referring to FIG. 4, there is illustrated a schematic representation of the first connection pads 1 and the first circuit 2 in a top view for illustrating a further embodiment of a semiconductor substrate. The arrangement of the first connection pads 1 is the same as that illustrated in FIGS. 2 and 3. The first circuit 2 is illustrated in more detail in FIG. 4. Each one of the first connection pads 1A-1F is connected via one of resistors R1 to R6 with a common node or common pad 2.1. The center pad 1A is connected via resistor R1 with the common pad 2.1, the quarter pad 1B is connected via resistor R2 with the common pad 2.1, the quarter 1C is connected via the resistor R3 with the common pad 2.1, the quarter pad 1D is connected via the resistor R4 with the common pad 2.1, the quarter pad 1E is connected via the resistor R5 with the common pad 2.1, and the perimeter pad 1F is connected via the resistor R6 with the common pad 2.1.

A connection element like a probe tip is brought into contact with the first connection pads 1 as illustrated in FIG. 2. A current is passed through the probe tip and the first connection pads 1. In dependence on the deviation of the position of the probe tip, the probe tip will come into contact with either one of the first connection pads 1A-F, or the probe tip or the lower contact area of the probe tip will be situated such that is in contact with two or even three of the first connection pads 1A-F so that the respective two or three connection pads are short-circuited by the probe tip.

The values of the resistors R1 to R6 are chosen such that in each situation a voltage can be measured at the common pad 2.1 which is individual for each one of the possible situation.

The following short-circuits are conceivable and be unambiguously evaluated:

short-circuit between connection pads 1A and 1B
short-circuit between connection pads 1A and 1C
short-circuit between connection pads 1A and 1D
short-circuit between connection pads 1A and 1E
short-circuit between connection pads 1B and 1C
short-circuit between connection pads 1C and 1D
short-circuit between connection pads 1D and 1E
short-circuit between connection pads 1E and 1B
short-circuit between connection pads 1B, 1C and 1A
short-circuit between connection pads 1C, 1D and 1A
short-circuit between connection pads 1D, 1E and 1A
short-circuit between connection pads 1E, 1B and 1A.

Each one of the connection pads 1B to 1E can also make a short-circuit with connection pad 1F.

If it is detected that the position of the probe tip is so that the probe tip solely contacts the perimeter connection pad 1F, it can be arranged that a complete shut-down is initiated so that in this case a complete re-arrangement of the positioning apparatus will be necessary. This can also be provided if the perimeter connection pad 1F is short circuited with one of the connection pads by the probe tip.

According to the embodiment of FIG. 4, each one of the conceivable configurations with respect to the position of the probe tip will result in a specific voltage value appearing at the common node or common pad 2.1. According to a further embodiment, it is also possible that in a digital implementation of the circuit, each one of the conceivable electrical configurations will result in a specific bit sequence which is delivered by the circuit 2 to the common pad 2.1.

Figure 5:
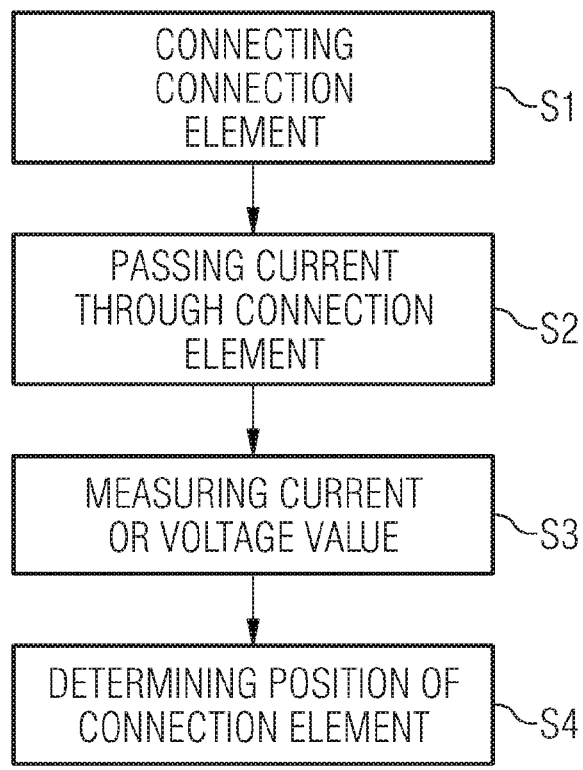
FIG. 5 illustrates a flow diagram of one embodiment of a method for determining the position of a connection element.

Referring to FIG. 5, there is illustrated a flow diagram of one embodiment of a method for determining the position of a connection element. The connection element is connected with a semiconductor substrate, the semiconductor substrate including first connection pads arranged thereon (s1), a current is passed through the connection element and one or more of the first connection pads (s2), a current value or a voltage value is measured in a first circuit connected to the first connection pads (s3), and the position of the connection element is determined from the measured value (s4).

According to one embodiment of the embodiment of FIG. 5, a voltage value can be measured at a common node or common pad connected to each one of the first connection pads.

The above method can be performed by use of a semiconductor substrate as outlined in one of the embodiment of FIGS. 1 to 4, and the arrangements of connection pads and circuits as disposed thereon and described above.

According to one embodiment, the connection element is a probe tip.

Figure 6:
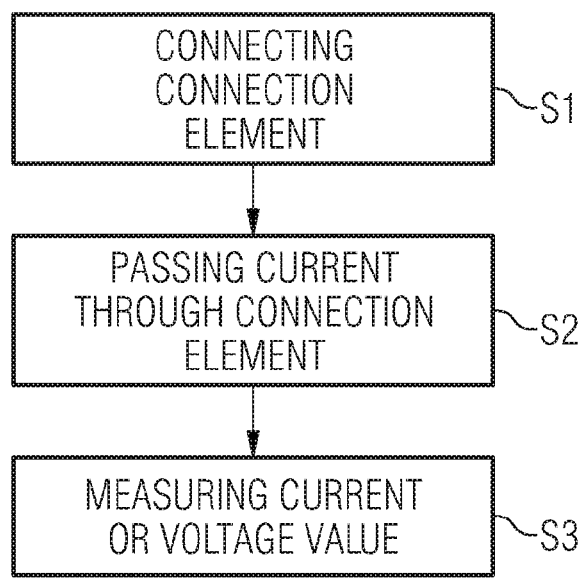
FIG. 6 illustrates a flow diagram of one embodiment of a method for connecting a connection element with a semiconductor substrate.

Referring to FIG. 6, there is illustrated a flow diagram of an embodiment of a method for connecting a connection element with a semiconductor substrate. The connection element is connected with a semiconductor substrate, the semiconductor substrate including first connection pads arranged thereon (s1), a current is passed through the connection element and one or more of the first connection pads (s2), and a current value or a voltage value is measured in a first circuit connected to the first connection pads (s3).

According to one embodiment, a voltage value is measured at a common node or common pad connected to each one of the first connection pads.

According to one embodiment, the connection element is a probe tip.

According to one embodiment, a position of the connection element is determined from the measured value.

The embodiment according to FIG. 6 can be carried out by use of one of the embodiments of a semiconductor substrate and the arrangement of first connection pads and a first circuit arranged thereon.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor comprising:
a detector arrangement to detect the position of a connection element, the detector arrangement comprising:
first connection pads arranged on a substrate surface; and
a first circuit connected to the first connection pads, the first circuit comprising a common node and first resistors,
wherein each one of the first resistors is connected between one of the first connection pads and the common node.

2. The semiconductor of claim 1, wherein the connection element is a probe tip.

3. The semiconductor of claim 1, wherein the first connection pads comprise a center connection pad and one or more further connection pads arranged near the center pad, symmetric with respect to the center pad.

4. The semiconductor of claim 1, wherein the detector arrangement further comprises:
second connection pads arranged on the substrate surface; and
a second circuit connected to the second connection pads.

5. A semiconductor comprising:
a detector arrangement to detect the position of a connection element, the detector arrangement comprising:
first connection pads arranged on a substrate surface; and
a first circuit connected to the first connection pads, the first circuit comprising a common node and first resistors,
wherein each one of the first resistors is connected between one of the first connection pads and the common node; and
wherein the first circuit comprises a common node and first resistors, wherein each one of the first resistors is connected between one of the first connection pads and the common node.

6. A semiconductor comprising:
first connection pads arranged on a substrate surface, the first connection pads comprising a center connection pad and one or more further connection pads arranged near the center pad, symmetric with respect to the center pad; and
a first circuit connected to the first connection pads, the first circuit comprising a common node and first resistors,
wherein each one of the first resistors is connected between one of the first connection pads and the common node.

7. The semiconductor of claim 6, further comprising:
second connection pads arranged on the substrate surface; and
a second circuit connected to the second connection pads.

8. A semiconductor comprising:
first connection pads arranged on a substrate surface, the first connection pads comprising a center connection pad and one or more further connection pads arranged near the center pad, symmetric with respect to the center pad; and
a first circuit connected to the first connection pads, the first circuit comprising a common node and first resistors,
wherein each one of the first resistors is connected between one of the first connection pads and the common node; and
wherein the first circuit comprises a common node and first resistors, wherein each one of the first resistors is connected between one of the first connection pads and the common node.

9. A semiconductor comprising:
a detector arrangement to detect the position of a connection element, the detector arrangement comprising first connection pads arranged on a substrate surface, the first connection pads comprising a center connection pad and one or more further connection pads arranged near the center pad, symmetric with respect to the center pad; and a first circuit connected to the first connection pads, the first circuit comprising a common node and first resistors, wherein each one of the first resistors is connected between one of the first connection pads and the common node.

10. The semiconductor of claim 9, further comprising:

second connection pads arranged on the substrate surface; and a second circuit connected to the second connection pads.

11. The semiconductor of claim 9, wherein the connection element is a probe tip.

12. A semiconductor comprising:

a detector arrangement to detect the position of a connection element, the detector arrangement comprising first connection pads arranged on a substrate surface, the first connection pads comprising a center connection pad and one or more further connection pads arranged near the center pad, symmetric with respect to the center pad; and a first circuit connected to the first connection pads, the first circuit comprising a common node and first resistors, wherein each one of the first resistors is connected between one of the first connection pads and the common node; and wherein the first circuit comprises a common node and first resistors, wherein each one of the first resistors is connected between one of the first connection pads and the common node.

* * * * *